United States Patent
Cochell et al.

(10) Patent No.: US 11,916,552 B2
(45) Date of Patent: Feb. 27, 2024

(54) METHOD FOR SUPPORTING MULTIPLE CONCURRENT PLUGINS IN A PROGRAMMABLE INTEGRATED CIRCUIT

(71) Applicant: XILINX, INC., San Jose, CA (US)

(72) Inventors: Ellery Cochell, Denver, CO (US); Ripduman Singh Sohan, San Jose, CA (US); Kieran Mansley, Cambridge (GB)

(73) Assignee: XILINX, INC., San Jose, CA (US)

( * ) Notice: Subject to any disclaimer, the term of this patent is extended or adjusted under 35 U.S.C. 154(b) by 178 days.

(21) Appl. No.: 17/690,845

(22) Filed: Mar. 9, 2022

(65) Prior Publication Data

US 2023/0291406 A1 Sep. 14, 2023

(51) Int. Cl.
*H03K 19/1776* (2020.01)
*H03K 19/17756* (2020.01)
*G06F 30/34* (2020.01)
*H03K 19/00* (2006.01)

(52) U.S. Cl.
CPC ......... *H03K 19/1776* (2013.01); *G06F 30/34* (2020.01); *H03K 19/17756* (2013.01); *H03K 19/00* (2013.01)

(58) Field of Classification Search
CPC ......... H03K 19/1776; H03K 19/17756; H03K 19/00; G06F 30/34
See application file for complete search history.

(56) References Cited

U.S. PATENT DOCUMENTS

| | | | |
|---|---|---|---|
| 7,199,608 B1* | 4/2007 | Trimberger | H03K 19/17768 326/38 |
| 9,722,613 B1* | 8/2017 | Schultz | H03K 19/1774 |
| 10,651,853 B1* | 5/2020 | Kong | G06F 30/392 |
| 10,990,547 B2 | 4/2021 | Thyamagondlu et al. | |
| 2005/0203988 A1* | 9/2005 | Nollet | G06F 15/7825 709/201 |
| 2021/0042252 A1* | 2/2021 | Thyamagondlu | H03K 19/17756 |

* cited by examiner

*Primary Examiner* — Farley Abad
(74) *Attorney, Agent, or Firm* — Patterson + Sheridan, LLP

(57) ABSTRACT

Techniques and apparatus for dynamically modifying a kernel (and associated user-specified circuitry) for a dynamic region of a programmable integrated circuit (IC) without affecting (e.g., while allowing) operation of other kernels ((and other associated user-specified circuitry) in the programmable IC. Dynamically modifying a kernel may include, for example, unloading an existing kernel, loading a new kernel, or replacing a first kernel with a second kernel). In the case of networking (e.g., in a data center application) where the programmable IC may be part of a hardware acceleration card (e.g., a network interface card (NIC)), the kernel may be user code referred to as a "plugin."

20 Claims, 9 Drawing Sheets

METHOD FOR SUPPORTING MULTIPLE CONCURRENT PLUGINS IN A PROGRAMMABLE INTEGRATED CIRCUIT

TECHNICAL FIELD

Examples of the present disclosure generally relate to programmable integrated circuits (ICs), and more particularly, to changing kernels (and associated user-specified circuitry) in programmable ICs without affecting operation of other kernels (and associated user-specified circuitry) in the programmable ICs.

BACKGROUND

A programmable integrated circuit (IC) refers to a type of device that includes programmable logic. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external programmable read-only memory (PROM)) or written into the FPGA by an external device. The collective states of the individual memory cells then determine the function of the FPGA.

Modem programmable ICs have evolved to include programmable logic in combination with one or more other subsystems. For example, some programmable ICs have evolved into System-on-Chips or "SoCs" that include both programmable logic and a hardwired processor. Other varieties of programmable ICs include additional and/or different subsystems. The phrase "programmable IC" refers to devices that include at least a portion of programmable logic and that are either partially or fully programmable.

In general, the functionality of programmable ICs is controlled by the configuration data provided to the device for that purpose. A set of configuration data provided to a programmable IC may be referred to as a "kernel." The data bits may be stored in volatile memory (e.g., static memory cells, as in FPGAs and some other programmable ICs such as complex programmable logic devices (CPLDs)), in non-volatile memory (e.g., flash memory, as in some CPLDs), or in any other type of memory cell.

Plugins may be considered as the equivalent of compute kernels, but plugins are focused on networking specifically. A programmable IC implemented on a network interface card (NIC) can extend network functionality by including a plugin that can augment and/or extend the network data plane. Currently, if multiple users are sharing a NIC having a programmable IC and one user wants to load a different plugin, plugins for all users in the programmable IC should typically be brought down, as loading a different plugin in the programmable IC conventionally involves swapping the hardware of the programmable IC out for all users (e.g., an entire dynamic region for the plugins).

Therefore, it is desirable to develop circuits and techniques enabling a NIC (or other hardware) having a programmable IC to dynamically modify a kernel (e.g., a plugin) in the programmable IC without affecting operation of other kernels in the programmable IC.

SUMMARY

Examples described herein generally relate to circuits and methods for dynamically modifying a kernel (and associated user-specified circuitry) for a programmable integrated circuit (IC) without affecting operation of other kernels ((and associated user-specified circuitry) in the programmable IC.

In one example, a method of dynamic modification is provided. The method generally includes sending a first message, from a programmable IC to a host, indicating that a modification of at least a first user-specified circuit in a first partial reconfiguration (PR) region will occur. The programmable IC includes a static region of programmable circuitry and a dynamic region of programmable circuitry. The dynamic region generally includes a plurality of PR regions including the first PR region, where each PR region is capable of supporting one or more user-specified circuits. The method also generally includes causing a memory to clear and release one or more memory resources related to the first user-specified circuit and to effectively ignore requests from the first PR region, while allowing at least one of other memory resources related to other user-specified circuits to operate or accesses to the memory from other PR regions; and modifying the at least the first user-specified circuit in the first PR region.

In another example, a programmable IC is provided. The programmable IC generally includes a static region of programmable circuitry and a dynamic region of programmable circuitry, the dynamic region comprising a plurality of PR regions, wherein each PR region is capable of supporting one or more user-specified circuits. The programmable IC is generally configured to send a first message to a host, indicating that a modification of at least a first user-specified circuit in a first PR region of the plurality of PR regions will occur; to cause a memory to clear and release one or more memory resources related to the first user-specified circuit and to effectively ignore requests from the first PR region, while allowing at least one of other memory resources related to other user-specified circuits to operate or accesses to the memory from other PR regions; and to modify the at least the first user-specified circuit in the first PR region.

In yet another example, a hardware acceleration card is provided. The hardware acceleration card includes a memory and a programmable IC coupled to the memory. The programmable IC generally includes a static region of programmable circuitry and a dynamic region of programmable circuitry, the dynamic region comprising a plurality of PR regions, wherein each PR region is capable of supporting one or more user-specified circuits. The programmable IC is generally configured to send a first message to a host, indicating that a modification of at least one user-specified circuit in a PR region of the plurality of PR regions will occur; to cause the memory to clear and release one or more memory resources related to the at least one user-specified circuit and to effectively ignore requests from the PR region, while allowing at least other memory resources related to other user-specified circuits to operate or accesses to the memory from other PR regions; and to modify the at least one user-specified circuit in the PR region.

These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
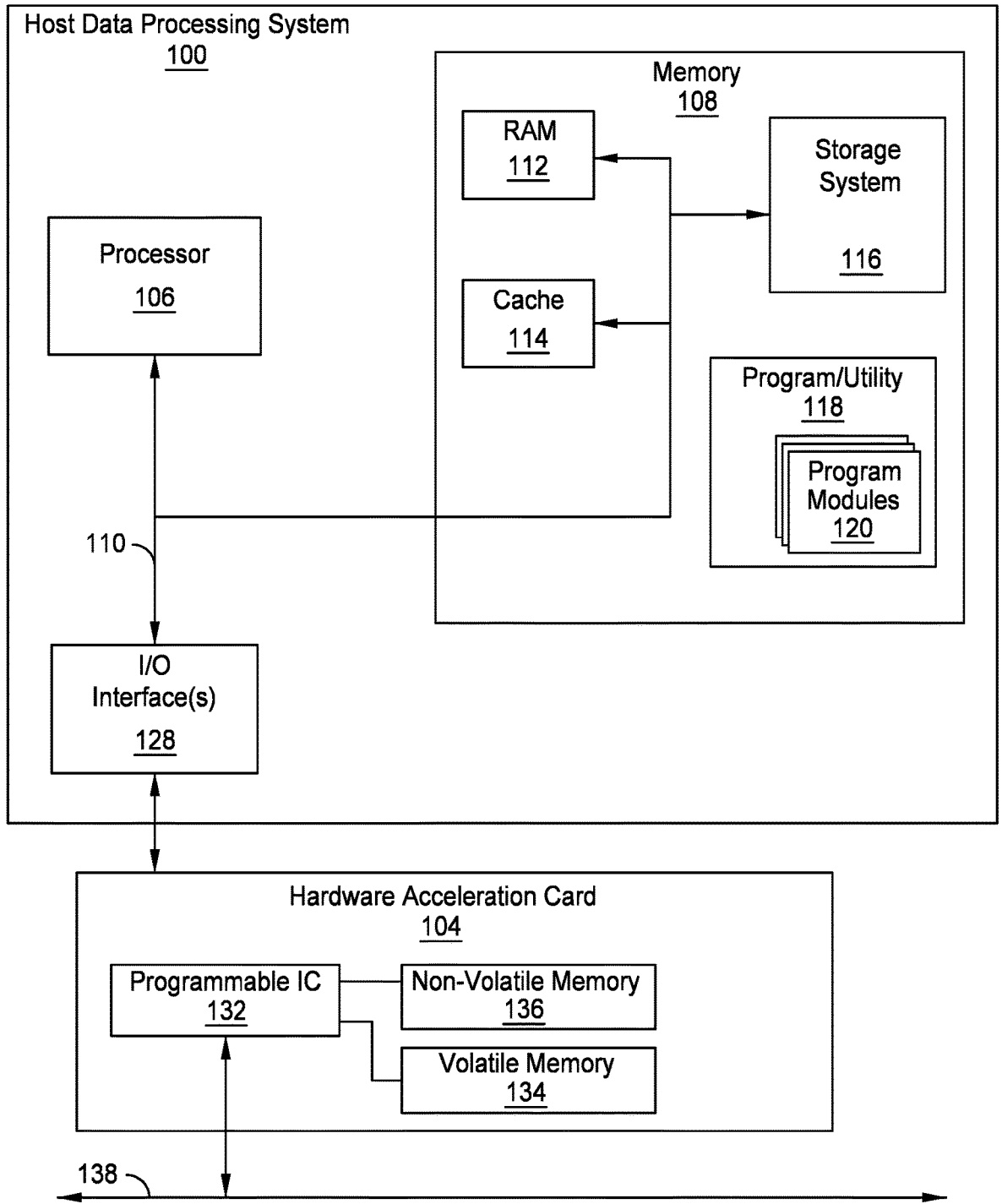
FIG. 1 illustrates a block diagram of an example host data processing system and a hardware acceleration card, in which examples of the present disclosure may be practiced.

Examples of the present disclosure provide techniques and apparatus for dynamically modifying a kernel (and associated user-specified circuitry) for a dynamic region of a programmable integrated circuit (IC) without affecting operation of other kernels ((and other associated user-specified circuitry) in the programmable IC. Dynamically modifying a kernel may include, for example, unloading an existing kernel, loading a new kernel, or replacing a first kernel with a second kernel). In the case of networking (e.g., in a data center application) where the programmable IC may be part of a hardware acceleration card (e.g., a network interface card (NIC)), the kernel may be user code referred to as a "plugin." It is to be understood that examples of the present disclosure are directed to kernels generally, but that plugins are used as a specific example and that the terms "kernel" and "plugin" may be used interchangeably throughout the remainder of the present disclosure.

Most network interface cards (NICs) in datacenters today are expected to have 99%+ uptime, and bringing the NIC down in order to load a new function (e.g., a new plugin) on the device is undesirable and problematic. One of the main advantages of NICs containing programmable ICs is having a portion of the NIC that can be reprogrammed on the fly by the end user without having to bring down the NIC itself. These functions can extend, modify, or replace existing data plane functions that exist as part of a standard NIC to make a fully customized and optimized NIC that the end user can adapt for their specific design. One of the existing limitations to current NICs containing programmable ICs is that only one function can be loaded at a time, which limits the flexibility of the NIC to support multiple independent users concurrently, as well as supporting multiple independently controlled functions.

Aspects of the present disclosure provide a method for a NIC including a programmable IC to dynamically update a plugin without affecting the operation of other plugins and without having to stop operation of the NIC (e.g., allowing the other plugins to operate, such as continuing to operate). The provided methods include storing each plugin in an independent dynamic region (also referred to as "partial reconfiguration (PR)" region) of the programmable IC, configuring a platform management unit to determine a dynamic region in which to install a new plugin, utilizing a configuration portal (e.g., an internal configuration access port (ICAP), bitstream programmer, or other suitable interface for downloading plugins) to download a new plugin into a dynamic region, configuring a memory controller to prevent updates to memory locations by a plugin in a dynamic region being updated, configuring a streaming hub to prevent network traffic in or out of a dynamic region being updated, and holding a newly installed plugin in a reset state until the programmable IC is ready to activate the newly installed plugin.

One advantage of the provided methods is that such methods enable a NIC having a programmable IC to upload a new plugin or switch to a different plugin without having to stop and/or reconfigure other plugins. For example, if a host is shared between multiple users using different plugins in a NIC, then when one of the users wishes to change to a different plugin, that user can change plugins without affecting the operations of the plugins of the other users (e.g., allowing the plugins of the other users to begin or continue operating). In another example, if a host has a single user and that user is using multiple plugins including one plugin that the user wants to keep active (e.g., an Internet Protocol security (IPSEC) plugin), the user can keep the one plugin loaded and running continually for some network flows while other network flows associated with modifications of other plugins may be added or modified on the fly without bringing down the network flows related to the one plugin the user wants to keep active. Another advantage of the provided methods is that such techniques may make development of new plugins simpler and faster, as developers may simply design and integrate their own plugin, contrasted with previous techniques where developing a new plugin may entail integrating the new plugins with other plugins that are to be run in the programmable IC of the NIC.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, the phrase "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

Example Host Data Processing System with a Hardware Acceleration Card

FIG. 1 illustrates a block diagram of an example system including a host data processing system (host system) 100 and a hardware acceleration card (card) 104 in which aspects of the present disclosure may be practiced. The components of host system 100 may include, but are not limited to, one or more processors 106 (e.g., central processing units (CPUs)), a memory 108, and a bus 110 that couples various system components including memory 108 to processor(s) 106. Processor(s) 106 may include any of a variety of processors that are capable of executing program code. Example processor types include, but are not limited to, processors having an x86 type of architecture (IA-32, IA-64, etc.), Power Architecture, ARM processors, and the like.

Bus 110 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Host system 100 typically includes a variety of computer-readable media. Such media may be any available media that is accessible by host system 100 and may include any combination of volatile media, non-volatile media, removable media, and/or non-removable media.

Memory 108 may include computer-readable media in the form of volatile memory, such as random-access memory (RAM) 112 and/or cache memory 114. Host system 100 may also include other removable/non-removable, volatile/non-volatile computer system storage media. By way of example, storage system 116 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 110 by one or more data media interfaces. As will be further depicted and described below, memory 108 may include at least one computer program product having a set (e.g., at least one) of program modules (e.g., program code) that are configured to carry out the functions and/or operations described within this disclosure.

For example, program/utility 118, having a set (at least one) of program modules 120 which may include, but are not limited to, an operating system, one or more application programs, other program modules, and/or program data, is stored in memory 108. Program modules 120 generally carry out the functions and/or methodologies described herein at least with respect to operations performed by host system 100. For example, program modules 120 may include one or more applications and a driver or daemon for communicating with hardware acceleration card 104 and/or programmable IC 132.

Program/utility 118 is executable by processor(s) 106. Program/utility 118 and any data items used, generated, and/or operated upon by processor(s) 106 are functional data structures that impart functionality when employed by processor(s) 106. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Host system 100 may include one or more input/output (I/O) interfaces 128 communicatively linked to bus 110. I/O interface(s) 128 allow host system 100 to communicate with external devices, couple to external devices that allow user(s) to interact with host system 100, couple to external devices that allow host system 100 to communicate with other computing devices, and the like. For example, host system 100 may be communicatively linked to a hardware acceleration card 104 through I/O interface(s) 128. Host system 100 may be coupled to other external devices such as a keyboard and/or display (not shown) via I/O interface(s) 128. Examples of I/O interfaces 128 may include, but are not limited to, network cards, modems, network adapters, hardware controllers, etc.

In an example implementation, the I/O interface 128 through which host system 100 communicates with hardware acceleration card 104 is a PCIe adapter. Hardware acceleration card 104 may be implemented as a circuit board that couples to host system 100. Hardware acceleration card 104 may, for example, be inserted into a card slot, e.g., an available bus and/or PCIe slot, of host system 100.

Hardware acceleration card 104 includes a programmable IC 132. Hardware acceleration card 104 also includes volatile memory 134 coupled to programmable IC 132 and non-volatile memory 136 also coupled to the programmable IC 132. Volatile memory 134 may be implemented as a RAM and is considered a "local memory" of programmable IC 132, whereas memory 108, being within host system 100, is not considered local to programmable IC 132. Memory 108, for example, is local to host system 100. In some implementations, volatile memory 134 may include multiple gigabytes of RAM, e.g., 64 GB of RAM. Non-volatile memory 136 may be implemented as flash memory. Non-volatile memory 136 is considered local to programmable IC 132.

In the example of FIG. 1, programmable IC 132 is connected to a network 138. In one example, network 138 is an Ethernet type of network. Network 138 may operate at any of a variety of different speeds. For example, network 138 may be a 10 gigabits per second (Gbps), 25 Gbps, 50 Gbps, 100 Gbps, 200 Gbps, 400 Gbps, or other speed network. In particular implementations, network 138 may be, include, or couple to a 5 Gbps network. Programmable IC 132 includes an Ethernet interface (not shown) that is used to connect to, e.g., communicatively link, programmable IC 132 to network 138. For example, programmable IC 132 may be connected via network 138 to an Ethernet switch or one or more other network-connected devices. For purposes of illustration, the term "network" refers to network 138 herein, e.g., an Ethernet network.

FIG. 1 is not intended to suggest any limitation as to the scope of use or functionality of the examples described herein. Host system 100 is an example of computer hardware (e.g., a system) that is capable of performing the various operations described within this disclosure relating to hardware acceleration card 104 and/or programmable IC 132.

Host system 100 is only one example implementation of a computer that may be used with a hardware acceleration card. Host system 100 is shown in the form of a computing device, e.g., a computer or server. Host system 100 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

Some computing environments, e.g., cloud computing environments and/or edge computing environments using host system 100 or other suitable data processing system, generally support the FPGA-as-a-Service (FaaS) model where user functions are hardware accelerated as user-specified or custom circuit designs, and implemented within programmable ICs operating under control of host computer systems. Other examples of cloud computing models are described by the National Institute of Standards and Technology (NIST) and, more particularly, by the Information Technology Laboratory of NIST.

Host system 100 is operational with numerous other general-purpose or special-purpose computing system environments or configurations. Examples of computing systems, environments, and/or configurations that may be suitable for use with host system 100 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Example Programmable Integrated Circuit Architecture

Figure 2:
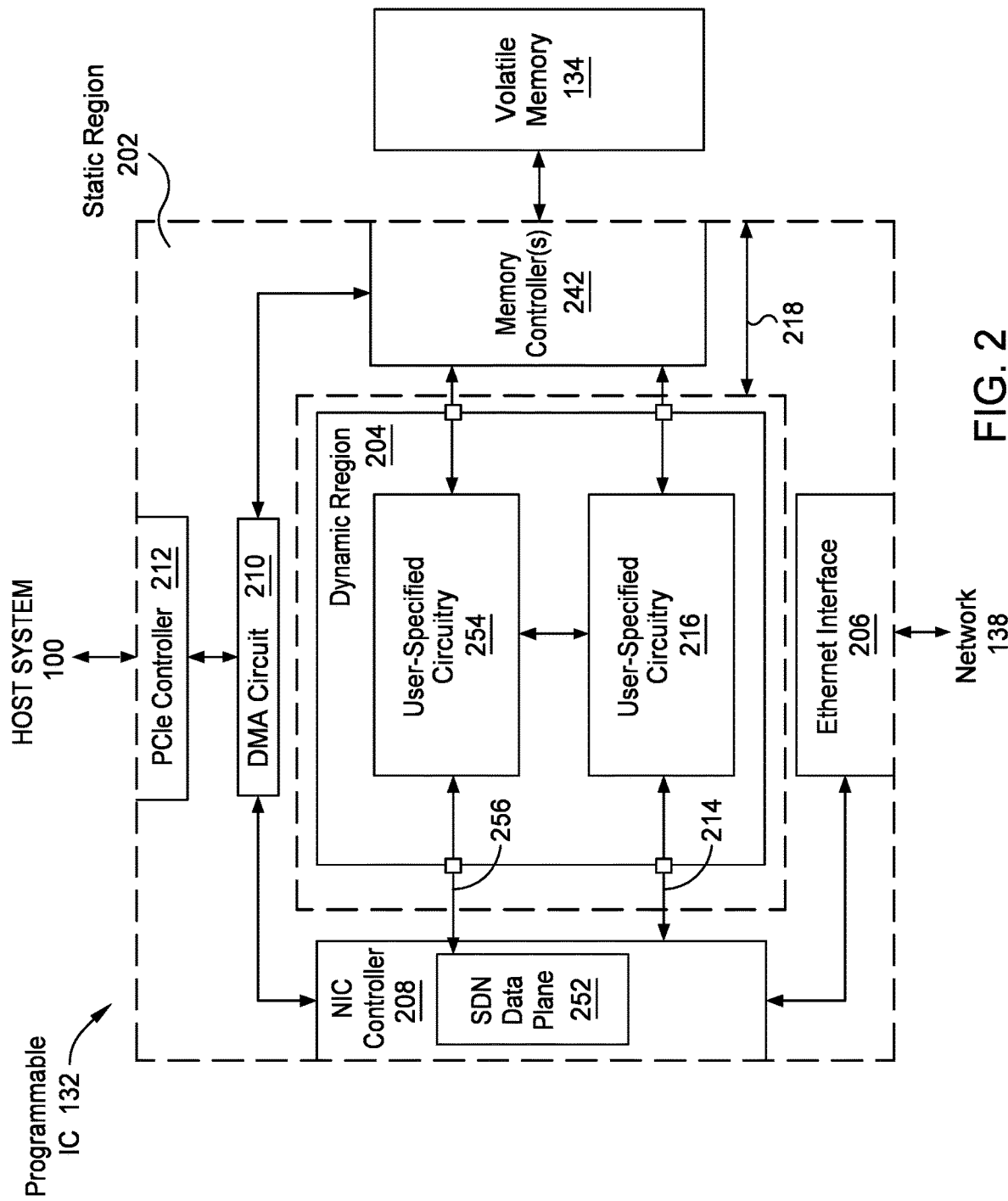
FIG. 2 illustrates a block diagram of an example platform implemented in a programmable integrated circuit (IC), in which examples of the present disclosure may be practiced.

FIG. 2 illustrates an example platform 218 implemented in programmable IC 132 of FIG. 1. Programmable IC 132 includes a static region 202 of programmable circuitry and a dynamic region 204 of programmable circuitry. While both static region 202 and dynamic region 204 are implemented using programmable circuitry, this is only an example embodiment of the present disclosure. One or both regions may include one or more hardwired circuit blocks.

Static region 202 represents a region of programmable circuitry of programmable IC 132 that, once configured with a circuit design, does not change over time. While static region 202 may be reconfigured, such an operation would take programmable IC 132 offline (e.g., offline from host system 100 and/or network 138). For purposes of illustration, static region 202 is shown with shading and is used to implement a platform 218 that provides networking operations (e.g., a network platform). Platform 218 is specified by a circuit design that is loaded into programmable IC 132, e.g., as a configuration bitstream. In the example of FIG. 2, platform 218 includes the various circuit blocks included in the shaded region. Platform 218, once implemented in programmable IC 132, provides functional networking, host system interfaces, and optionally memory interfaces for the duration of operation. Platform 218 is capable of passing network data from an Ethernet interface 206 to host system 100 (e.g., processor 106) via a communication bus with basic network interface controller (NIC) functionality.

Dynamic region 204 represents a region of programmable circuitry of programmable IC 132 that may be dynamically reconfigured over time to implement different user-specified (e.g., custom) circuits therein. The user-specified circuits (associated with user code referred to herein as "kernels" or "plugins") implemented in dynamic region 204 are designed to connect to circuit block(s) implemented in platform 218 in static region 202. In general, user-specified circuits implemented in dynamic region 204 are used to extend the functionality and/or operability of platform 218.

Within static region 202, a circuit design has been loaded to create platform 218. For example, a full or partial configuration bitstream specifying platform 218 is loaded into programmable IC 132. In the example of FIG. 2, platform 218 includes an Ethernet interface 206, a NIC controller 208, a direct memory access (DMA) circuit 210, and a Peripheral Component Interconnect Express (PCIe) controller 212. Thus, Ethernet interface 206, NIC controller 208, DMA circuit 210, and PCIe controller 212 are implemented in static region 202. Ethernet interface 206 is connected to NIC controller 208. NIC controller 208 connects to DMA circuit 210. DMA circuit 210 connects to PCIe controller 212. Ethernet interface 206 is capable of establishing a communication link to network 138 (e.g., a node or switch therein). PCIe controller 212 is capable of establishing a communication link to host system 100.

In other examples, platform 218 may use other types of interfaces to connect to network 138. Additionally or alternatively, platform 218 may use other types of interfaces to connect to host system 100. The particular examples described within this disclosure are provided for purposes of illustration and not limitation. Other alternative types of interfaces may be used.

In the example of FIG. 2, each of Ethernet interface 206, NIC controller 208, DMA circuit 210, and PCIe controller 212 is implemented using programmable circuitry. In one or more other example implementations, one or more or all (e.g., any combination) of Ethernet interface 206, DMA circuit 210, and/or PCIe controller 212 may be implemented as hardwired circuit blocks.

NIC controller 208 is implemented with one or more communication interfaces 214 that connect to dynamic region 204. In particular implementations, communication interface 214 and/or other communication interfaces between NIC controller 208 and dynamic region 204 may be implemented as stream interfaces. An example of a stream interface is one compliant with AMBA® 4 AXI4-Stream Protocol (e.g., "AXI"). Other types of stream interfaces may be used to connect NIC controller 208 to dynamic region 204, and AXI is provided only as a non-limiting example. Another example of a stream interface may be a network-on-chip.

In one aspect, communication interface 214 is software-controllable. For example, the configuration bitstreams used to implement user-specified circuitry may be stored with associated metadata. The metadata may specify the state of the communication interface 214, e.g., whether on or off. The metadata may specify which of communication interfaces 214, in the case of a plurality of such interfaces, are enabled and are to be used. In this regard, the metadata describes connectivity between platform 218 and dynamic region 204 and/or user-specified circuitry 216.

As an example, communication interface 214 may be implemented using one or more multiplexers that may be provided control signals (e.g., select signals) from a control interface. The select signals may be specified by the metadata. Once a configuration bitstream is loaded into programmable IC 132 to implement user-specified circuitry 216, host system 100 is capable of obtaining the metadata corresponding to the configuration bitstream and writing the metadata to programmable IC 132. The metadata may be provided to the control interface, which generates the appropriate select signals to the multiplexers of communication interfaces 214 to activate and/or deactivate communication interfaces 214 as needed to communicate with user-specified circuitry 216.

Via communication interface 214, data can move from platform 218 into dynamic region 204, enter and be processed by user-specified circuitry 216 in dynamic region 204, and return to platform 218. NIC controller 208 may have a plurality of communication interfaces that may be software controllable as described. For example, in terms of ingress, NIC controller 208 may receive data from network 138 via Ethernet interface 206. NIC controller 208 may or may not operate on the data prior to providing the data to user-specified circuitry 216 over communication interface 214. User-specified circuitry 216 may operate on the received data and provide the processed data back to NIC controller 208 via communication interface 214. User-specified circuitry 216, for example, may perform one or more packet processing, or Smart NIC, functions. NIC controller 208 may or may not perform further processing on the data and provide the data to host system 100 via DMA circuit 210 and PCIe controller 212. In another example, NIC controller 208 may be configured to route data received from Ethernet interface 206 back to Ethernet interface 206 to network 138 after processing performed by NIC controller 208 and/or user-specified circuitry 216 or without any such processing.

In terms of egress, NIC controller 208 may receive data from host system 100 via PCIe controller 212 and DMA circuit 210. NIC controller 208 may or may not operate on the data prior to providing the data to the user-specified circuitry 216 over communication interface 214. User-specified circuitry 216 and/or user-specified circuitry 254 may operate on the received data and provide the processed data back to NIC controller 208 via communication interface 214. NIC controller 208 may or may not perform further processing on the data prior to providing the data to network 138 via Ethernet interface 206. In another example, NIC controller 208 may be configured to route data received from host system 100 back to host system 100 after processing performed by NIC controller 208, user-specified circuitry 216, and/or user-specified circuitry 254 or without any such processing.

In the example of FIG. 2, static region 202 refers to the portions of programmable IC 132 that are external to dynamic region 204. Platform 218, as implemented in static region 202, does not change (frequently), e.g., remains static, while circuitry in dynamic region 204 can be changed to implement other, different user-specified circuit designs over time. In the example of FIG. 2, two user-specified circuit designs are implemented in dynamic region 204 and shown as user-specified circuitry 216 and user-specified circuitry 254. Dynamic region 204 may be reconfigured over time to implement different user-specified circuitry (e.g., circuits other than user-specified circuitry 216 and user-specified circuitry 254) while platform 218 in static region 202 continues to operate uninterrupted.

User-specified circuitry 216, for example, is capable of performing any of a variety of network acceleration functions. In this regard, the functionality of platform 218 and, e.g., NIC controller 208, though itself static, may be augmented through the addition of user-specified circuitry 216. In one aspect, user-specified circuitry 216 is capable of performing any of a variety of incremental network acceleration functions since NIC controller 208 is capable of passing metadata so that user-specified circuitry 216 need not repeat operations that have already been performed, e.g., by NIC controller 208.

User-specified circuitry 216 and user-specified circuitry 254 may be dynamically inserted, removed, and/or replaced in-line with data (e.g., data from the network 138 (referred to as "network" or "ingress" data) and/or data from the host system 100 (referred to as "host" or "egress" data)) flowing through platform 218 in static region 202 between network 138 and host system 100 during operation of programmable IC 132 without interruption or loss of such data. In another aspect, in the case of virtual machines executing in host system 100, the terms "egress" and "ingress" may be used relative to the virtual machines. For example, egress data of a virtual machine executing in host system 100 may be directed to network 138 or to the ingress of another virtual machine also executing in host system 100. In any case, platform 218 is capable of maintaining communication links with network 138 via Ethernet interface 206 and with host system 100 via PCIe controller 212 while dynamic region 204 is dynamically reconfigured. Thus, while dynamic region 204 is reconfigured, programmable IC 132 appears to be "online" or operational to host system 100 and other devices connecting to programmable IC 132 via network 138.

Dynamic region 204 is implemented to include one or more partial reconfiguration (PR) regions. A PR region of programmable IC 132 refers to a region of programmable circuitry that is reserved for implementing one or more different user-specified (e.g., custom) circuit designs dynamically over time. Dynamic region 204 may include more than one PR region. In general, each different PR region implemented in dynamic region 204 is independently reconfigurable. For example, each user-specified circuit block (e.g., user-specified circuitry 216 and user-specified circuitry 254) may be implemented in its own independently reconfigurable PR region. In such configurations, the particular user-specified circuitry implemented in each PR region would be dynamically modifiable (e.g., reconfigurable) without modifying other user-specified circuitry implemented in dynamic region 204. For example, if user-specified circuitry 254 is in a first PR region and user-specified circuitry 216 is in a second PR region (as shown in FIG. 2), user-specified circuitry 254 may be removed and different user-specified circuitry may be added to the first PR region without disrupting operation of user-specified circuitry 216. Similarly, user-specified circuitry 216 may be removed and different user-specified circuitry may be added to the second PR region without disrupting operation of user-specified circuitry 254. In each case, platform 218 continues operating uninterrupted.

Though NIC controller 208 is shown to include one communication interface 214 in the example of FIG. 2, NIC controller 208 may include a plurality of different communication interfaces. The communication interfaces may be included in NIC controller 208 at one or more different stages included therein. This allows NIC controller 208 to exchange data with the user-specified circuitry 216 at any of a variety of different processing stages therein.

In the example of FIG. 2, a software-defined networking (SDN) data plane 252 is implemented in NIC controller 208. SDN data plane 252 is capable of decoupling the data and the control planes by implementing the data plane as part of platform 218. In this example, rather than implementing the data plane in software executing in host system 100, the data plane software is hardware accelerated and implemented as SDN data plane 252 within NIC controller 208.

In some example implementations, SDN data plane 252 can be customized using user-specified circuitry 254 (and/or other user-specified circuitry in dynamic region 204 that is connected to SDN data plane 252 via communication interface 256). For example, with ports connecting SDN data plane 252 with dynamic region 204, user-specified circuitry 254 may be configured to add a custom generic routing encapsulation (GRE) header to data and/or implement a custom parser. With a custom parser, for example, metadata may be passed along and associated with the new parser data. Further, the GREs may be modified, by way of user-specified circuitry 254, with network overlay(s). In any case, availability of one or more communication interfaces 256 allows SDN data plane 252 to be customized using programmable circuitry in dynamic region 204.

SDN data plane 252 enables programmatic access to make network administration more flexible. For example, to the extent that NIC controller 208 and/or SDN data plane 252 utilize a large flow table that is searched over the look-up interface, customized flow tables may be implemented as user-specified circuitry 216 and/or 254 within dynamic region 204. SDN data plane 252 alleviates the processing burden that would otherwise be placed on host system 100 to execute the data plane software.

In the example of FIG. 2, SDN data plane 252 may connect to dynamic region 204 via a communication interface 256. SDN data plane 252 may have more than one communication interface connected to dynamic region 204. In other examples, SDN data plan 252 may not include a communication interface to dynamic region 204.

In one example, user-specified circuitry 254 connects to NIC controller 208 and/or to SDN data plane 252 via communication interface 256. User-specified circuitry 254 may implement a custom flow table that allows NIC controller 208 to implement data flow diversion.

In another example, user-specified circuitry 216 may implement a video decoder and scaling circuit. User-specified circuitry 254 may implement a machine learning object detection circuit. With this configuration, dynamic region 204 is capable of performing real-time video processing and machine learning. This example illustrates how network attached real-time video decode followed by object detection and/or classification may be implemented using platform 218.

For example, the video decoder and scaling circuit is capable of operating on multiple different video streams received via network 138. The video streams may originate from security systems and/or cameras communicatively linked to network 138. The video decoder and scaling circuit is capable of decoding the received video streams. The video decoder and scaling circuit is capable of extracting one or more individual frames from the different video streams and scaling the extracted frames for use by the machine learning object detection circuit.

In the example of FIG. 2, NIC controller 208 is capable of performing basic NIC functions. The video decode and scaling functions and the machine learning inference for object detection and/or image classification functions are implemented as hardware-accelerated kernels within dynamic region 204. By implementing the functions as kernels in dynamic region 204, the kernels are capable of operating on the video streams in real-time. Real-time operation reduces latency since processing may be performed without the video streams traversing the networking stack of host system 100 (e.g., user-specified circuitry 254 and 216 operate on video prior to the data reaching host system 100). This accelerates processing performed by programmable IC 132. In addition, platform 218 reduces storage demands since images without any flagged objects can be discarded, while images (e.g., frames) with flagged objects can be saved for further analysis. Further, the workload placed on host system 100 is significantly reduced since cycles of processor(s) 106 can be used for other operations.

In another example, platform 218 of FIG. 2 may be used to perform inline malware detection on encrypted data traffic. In this example, platform 218 is capable of operating based on extracting certain information from data flows. The information may include the duration of the data flow, the number of packets sent from the client, the number of packets sent from the server, the number of bytes sent from the client, and the number of bytes sent from the server. For example, user-specified circuitry 216 may implement a classification and feature extraction circuit. The extracted information may be used with metadata from unencrypted portions of packet headers also extracted by user-specified circuitry 216 to train a random forest classifier implemented by user-specified circuitry 254. The trained classifier can then be used to detect malware.

In one aspect, the classifier may be run in real-time on packets coming into programmable IC 132 from network 138. User-specified circuitry 216 is capable of extracting features and classifying the packets into data flows. User-specified circuitry 216 is capable of feeding the determined information to user-specified circuitry 254. User-specified circuitry 254 may be preloaded with trained models for malware of interest. In response to user-specified circuitry 254 detecting malware, user-specified circuitry 254 is capable of sending a message to set up a filter within SDN data plane 252 to prevent any further network data sent from the attacker from reaching host system 100. In this example, NIC controller 208 and SDN data plane 252 run as part of platform 218, while feature extraction functions and classification for malware detection run as kernels that are loaded into dynamic region 204.

By performing the classification, extraction, and malware detection in real-time, malware can be blocked before the malware physically crosses the PCIe bus from programmable IC 132 to host system 100. This provides more robust protection for host system 100. The random forest classification technique allows detection of malware on encrypted traffic without requiring complex decryption and proxy techniques. In addition, performing this function on programmable IC 132 as opposed to an appliance provides better scaling through distribution of workload and protects against attacks from inside the data center.

The particular user-specified circuits described herein are provided for purposes of illustration and not limitation. The examples illustrate that any user-specified circuitry may be implemented in dynamic region 204 to extend the capabilities of platform 218. Further, while different blocks of user-specified circuitry can be included to communicate with NIC controller 208, the different blocks of user-specified circuitry may or may not communicate with one another.

Though memory access controller(s) 242 are shown, memory access controller(s) 242 are optional and may be omitted. Memory access controllers 242, when included, allow user-specified circuitry 254 and 216 to read and to write to volatile memory 134. Further, memory access controller(s) 242 allow host system 100 to read from and write to volatile memory 134.

Figure 3:
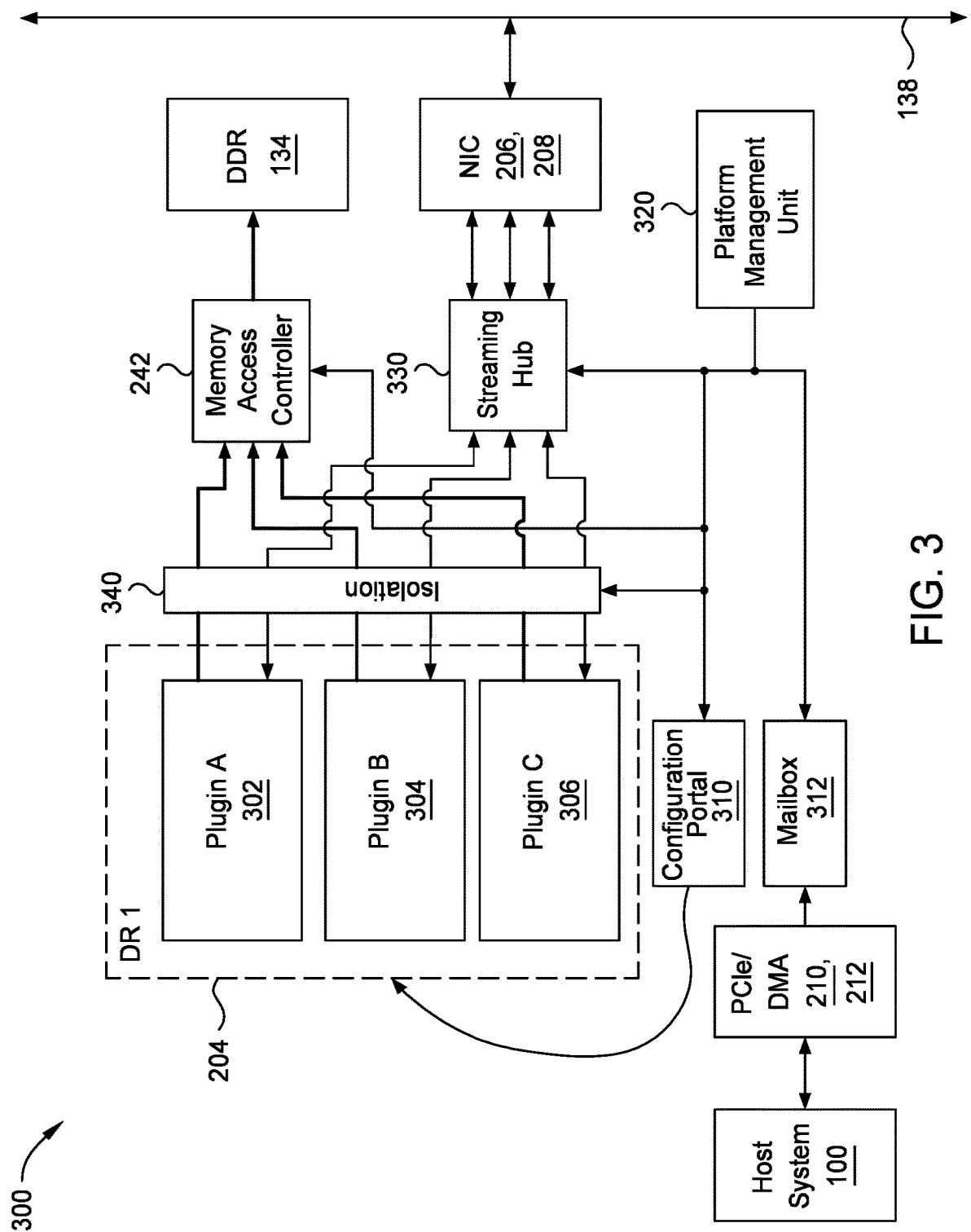
FIG. 3 shows a block diagram of an example programmable IC with a single dynamic region, in accordance with examples of the present disclosure.

FIG. 3 shows a block diagram of an example programmable IC 300 with a single dynamic region 204 (e.g., a single PR region) that supports multiple independent plugins 302, 304, and 306. The programmable IC 300 may be an example of the IC 132 of FIGS. 1 and 2. The programmable IC 300 includes many components that were previously described with respect to FIGS. 1 and 2 and are not further described.

Programmable IC 300 includes a platform management unit 320 that handles control and orchestration of the download and enablement of plugins (e.g., plugins 302, 304, and 306). The mailbox 312 handles communication between users on the host system 100 and the platform management unit 320. The streaming hub 330 controls the data flow between the plugins 302, 304, and 306 and the NIC controller 208 (e.g., with included Ethernet interface 206). The memory access controller 242 controls data flow between the plugins 302, 304, 306 and volatile memory 134 (labeled "DDR" for double date rate memory) (or alternatively embedded memory). The isolation block 340 is used to electrically isolate the static components (e.g., the memory access controller 242 and/or the streaming hub 330) from the dynamic region 204 (also referred to as a "reprogrammable region"). The dynamic region 204 may contain one or more plugins 302, 304, 306. The dynamic region 204 can be programmed using the configuration portal 310 (e.g., an internal configuration access port (ICAP)) in the shell. The configuration portal 310 may enable dynamic modification of the dynamic region 204, such as by loading or unloading one or more of the plugins 302, 304, 306. Examples of the configuration portal 310 may include a bitstream programmer in an FPGA or other programmable IC.

In the programmable IC 300, when one of the plugins (e.g., plugin 302) is to be swapped out (e.g., an existing user wants to change what plugin is used or a new user connects to the NIC and wants to load the user's own plugin application), all of the other plugins (e.g., 304 and 306) are conventionally brought down to make the swap because all plugins are typically reprogrammed in order to update any of the plugins.

Example Programmable Integrated Circuit with Multiple Dynamic Regions

Figure 4:
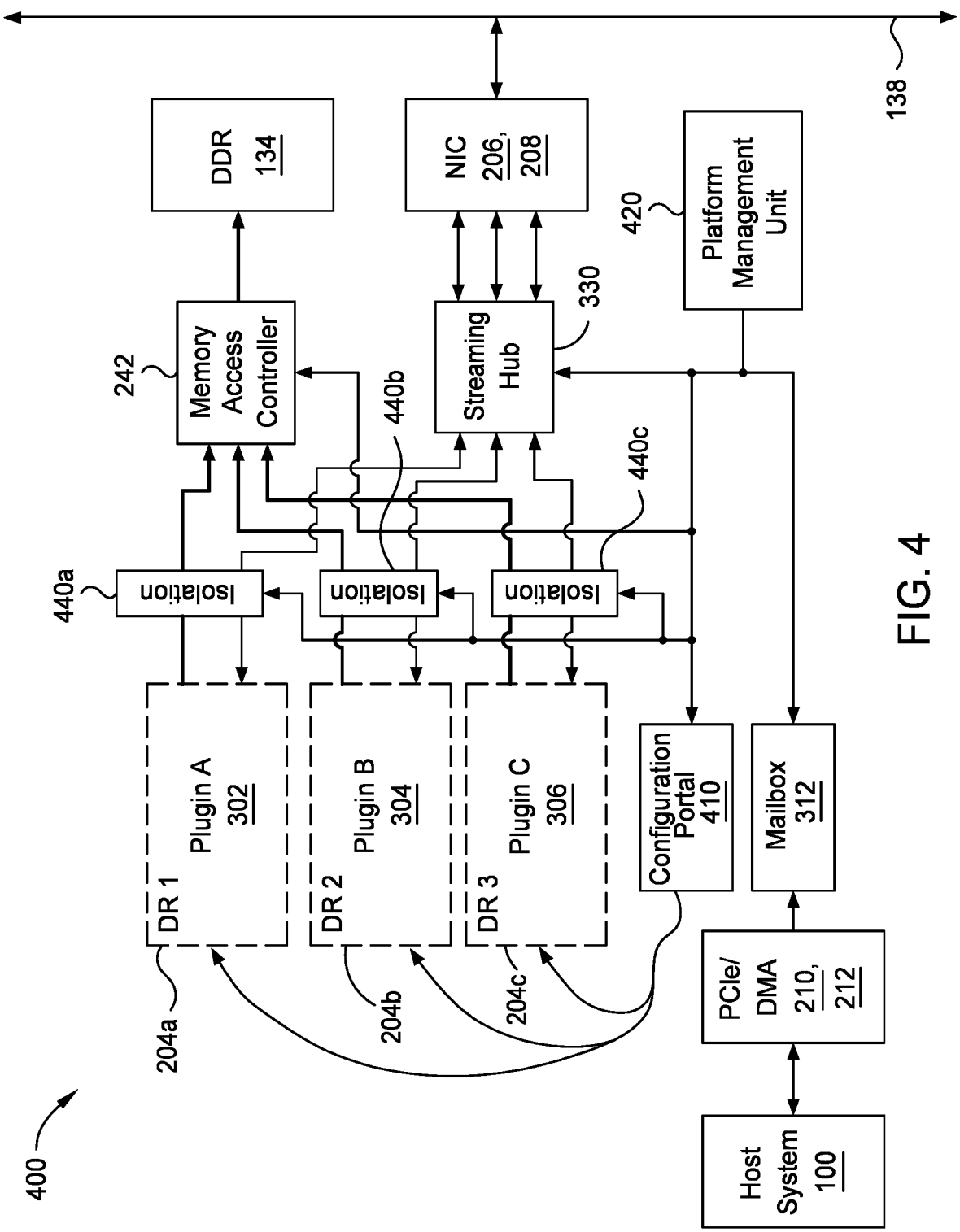
FIG. 4 shows a block diagram of an example programmable IC with a plurality of dynamic regions, in accordance with an example of the present disclosure.

FIG. 4 shows a block diagram of an example programmable IC 400 with a plurality of dynamic regions 204a, 204b, and 204c (also referred to as a plurality of PR regions, in a single dynamic region 204) that each supports a respective independent plugin 302, 304, or 306. The programmable IC 400 may be an example of the IC 132 of FIGS. 1 and 2. The programmable IC 400 includes many components that were previously described with respect to FIGS. 1-3 and are not further described. Programmable IC 400 includes a platform management unit 420 that handles control and orchestration of the download and enablement of plugins (e.g., plugins 302, 304, and 306). Each of the dynamic regions 204 may be electrically isolated from the static components (e.g., the memory access controller 242 and/or the streaming hub 330) by a corresponding one of the isolation blocks 440. Each dynamic region 204a-c can contain one or more of the plugins 302, 304, 306. Each dynamic region 204a-c can be independently programmed using a configuration portal 410 (e.g., an internal configuration access port (ICAP)) in the shell.

In the programmable IC 400, a plugin can be stopped and replaced without affecting traffic flowing to or from other plugins (e.g., by allowing the traffic to flow to or from the other plugins). When one of the plugins (e.g., plugin 302) is to be swapped out (e.g., an existing user wants to change what plugin is used or a new user connects to the NIC and wants to load the user's own plugin application), each of the other plugins (e.g., plugins 304 and 306) can continue operating, as each plugin can be stopped and replaced without affecting traffic flowing to or from plugins in other dynamic regions (in other PR regions). In some cases, a single user that controls the IC 400 may keep one or two plugins running while swapping out one of the other plugins. For example, a user may want to have an Internet protocol security (IPSEC) plugin loaded and running continually for some network flows traversing the IC 400 while adding or modifying other network flows on the fly. In the example, adding or modifying other network flows may demand plugins to be swapped out while the system is up and running without bringing down the flows related to IPSEC.

Figure 5:
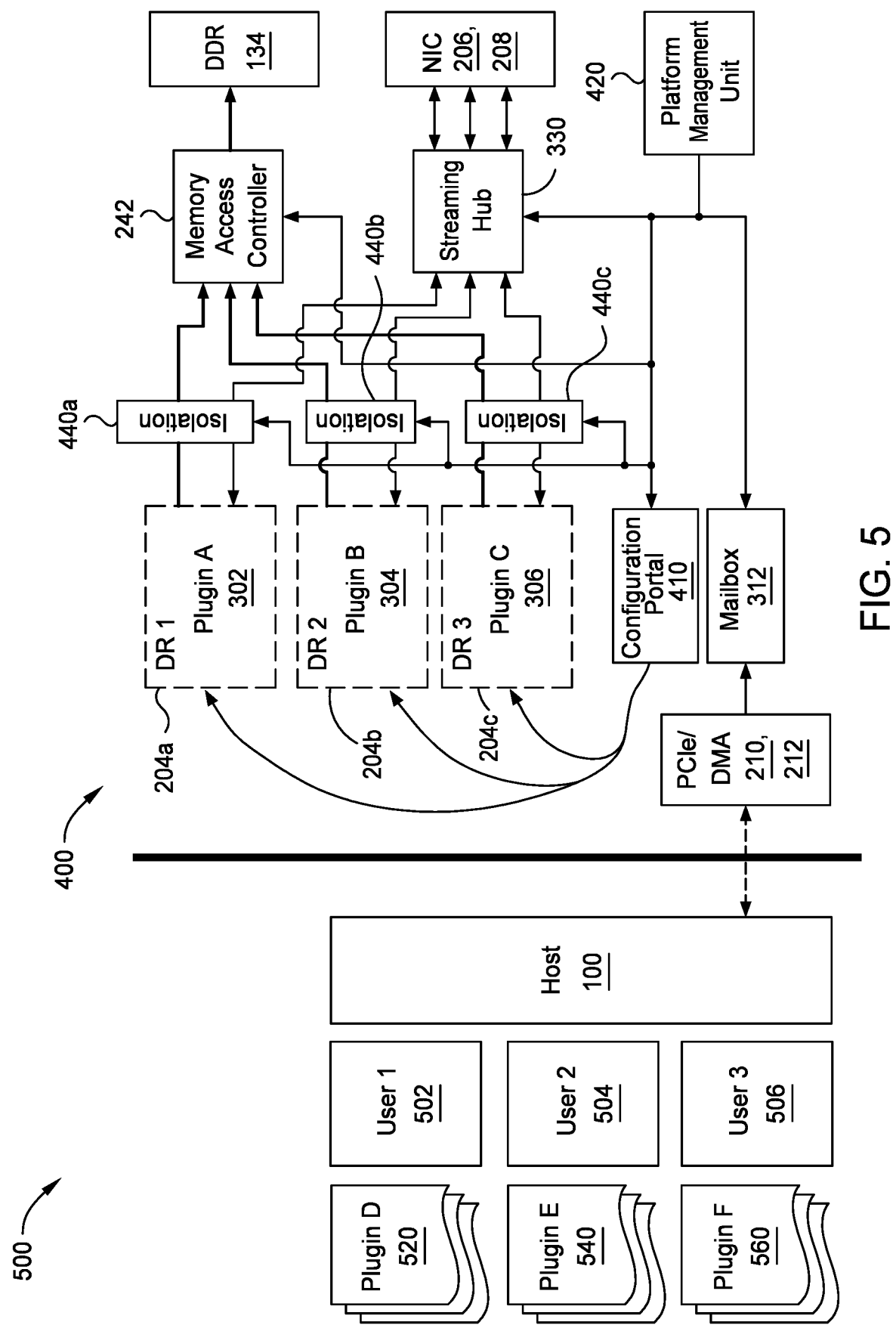
FIG. 5 shows a block diagram of an example of multiple users sharing a platform including the programmable IC of FIG. 4, in accordance with an example of the present disclosure.

FIG. 5 shows a block diagram of an example of multiple users 502, 504, and 506 sharing a platform 500 including the programmable IC 400. Each of the three users 502, 504, and 506 has access to the host system 100 and can send commands from host system 100 to the programmable IC 400 to control one of the dynamic regions 204. User 502 can send commands from host system 100 to control which plugin is activated in dynamic region 204a, user 504 can send commands from host system 100 to control which plugin is activated in dynamic region 204b, and user 506 can send commands from host system 100 to control which plugin is activated in dynamic region 204c. Thus, if user 502 determines to change from using plugin A 302 to using plugin D 520, user 502 can cause the programmable IC 400 to deactivate plugin A 302, install plugin D 520 in dynamic region 204a, and activate plugin D 520 without causing any interruption to the operation of plugin B 304 or plugin C 306. Similarly, user 504 can cause the programmable IC 400 to deactivate plugin B 304, install plugin E 540 in dynamic region 204b, and activate plugin E 540 without causing any interruption to the operation of plugin A 302 or plugin C 306. And user 506 can cause the programmable IC 400 to deactivate plugin C 306, install plugin F 560 in dynamic region 204c, and activate plugin F 560 without causing any interruption to the operation of plugin B 304 or plugin A 302

Figure 6A:
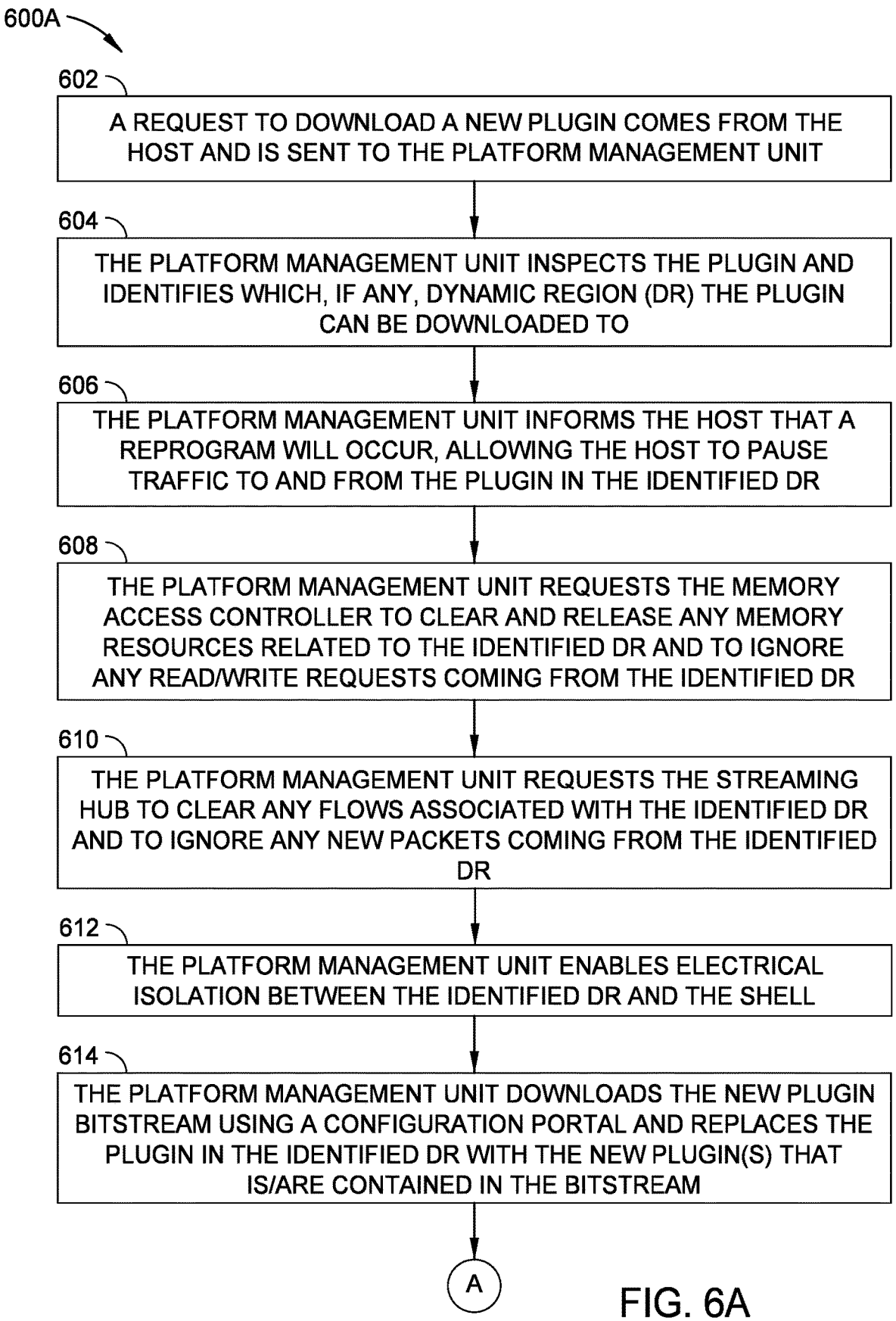
FIGS. 6A and 6B depict an algorithm 600 for downloading a plugin to a multiple dynamic region platform, in accordance with an example of the present disclosure.
Figure 6B:
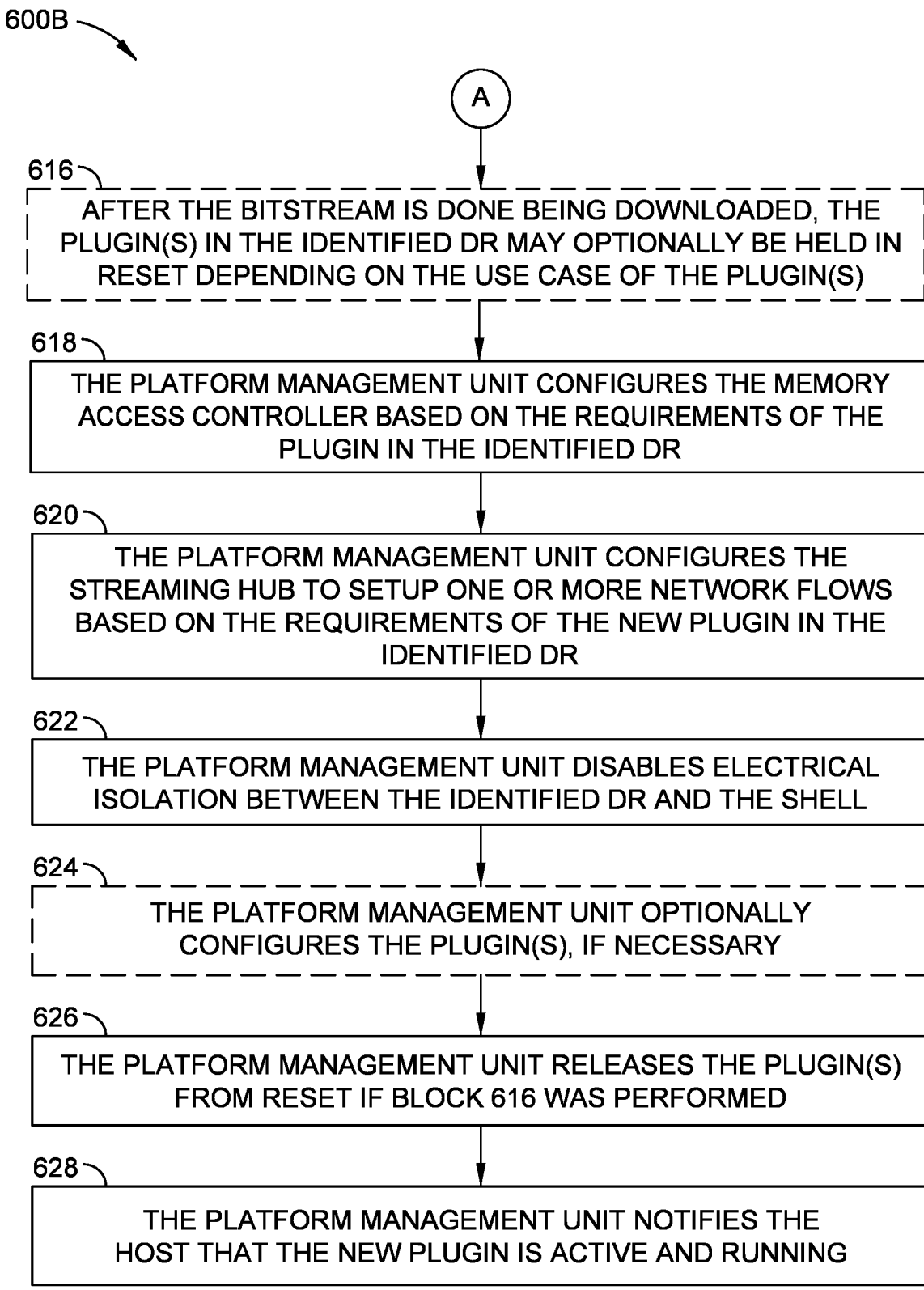

Example Operations for Downloading a Plugin to a Multiple Dynamic Region Platform FIGS. 6A and 6B depict an algorithm 600 for downloading a plugin to a multiple dynamic region platform, such as a platform including the programmable IC 400, shown in FIG. 4. The algorithm 600 will be illustrated with an example platform having three dynamic regions that each support one plugin (e.g., the platform of FIG. 4), but the present disclosure is not so limited, and the algorithm 600 can be used for a platform having N dynamic regions that can each support M plugins.

The algorithm 600 begins at block 602 with a request to download a new plugin comes from the host and is sent to the platform management unit. In the example, the request from the host system 100 is sent to the platform management unit 420 via the mailbox 312 or some other mechanism.

At block 604, the platform management unit inspects the plugin and identifies which, if any, dynamic region (DR) (also referred to as a PR region when a programmable IC is considered to have a single DR) to which the plugin can be downloaded. In this example, the platform management unit 420 identifies dynamic region 204a to which to download the plugin.

At block 606, the platform management unit informs the host that a reprogram will occur, allowing the host to pause traffic to and from the plugin in the identified DR. Thus, in the example, the platform management unit 420 informs the host system 100 that a reprogram of the plugin in dynamic region 204a, containing plugin A 302, will occur, allowing the host system 100 to pause traffic to and from plugin A 302.

At block 608, the platform management unit requests the memory access controller to clear and release any memory resources related to the identified dynamic region and to ignore any read/write requests coming from the identified dynamic region. Both actions are done without affecting any other memory regions or memory accesses coming from the other dynamic regions, as the memory regions and accesses are all independent of each other for each dynamic region. In the example, the platform management unit 420 requests the memory access controller 242 to clear and release any memory resources related to the dynamic region 204a and to ignore any read/write requests coming from the dynamic region 204a.

At block 610, the platform management unit requests the streaming hub to clear any flows associated with the identified DR and to ignore any new packets coming from the identified DR. Again, both actions are done without affecting any flows related to the other DRs as the network flows are wholly independent of each other for each dynamic region. In the example, the platform management unit 420 requests the streaming hub 330 to clear any flows associated with the DR 204a and to ignore any new packets coming from DR 204a.

At block 612, the platform management unit enables electrical isolation between the identified DR and the shell. In the example, the platform management unit 420 activates the isolation block 440a to enable isolation of DR 204a from the shell of the IC 400.

At block 614, the platform management unit downloads the new plugin bitstream using a configuration portal and replaces the plugin in the identified DR with the new plugin(s) that is/are contained in the bitstream. In the example, the platform management unit 420 downloads the new plugin using the configuration portal 410 and replaces the plugin in DR 204a with the new plugin(s) that is/are contained in the bitstream.

At block 616, after the bitstream is done being downloaded, the plugin(s) in the identified DR may optionally be held in reset depending on the use case of the plugin(s). In the example, the plugin(s) placed in the DR 204a may optionally be held in reset depending on the use case of the plugin(s).

At block 618, the platform management unit configures the memory access controller based on the properties of the new plugin in the identified DR. This will set up various read and write access to one or more regions in DDR. The memory access controller and platform management unit may ensure there are no memory conflicts with the other dynamic regions. In the example, the platform management unit 420 configures the memory access controller 242 based on the properties of the new plugin in DR 204a. In the example, the memory access controller 242 and the platform management unit 420 ensure there are no memory conflicts with the other dynamic regions 204b and 204c.

At block 620, the platform management unit configures the streaming hub to set up one or more network flows based on the properties of the new plugin in the identified DR. This may also set up the physical streaming connections between the identified DR and the NIC. The streaming hub and platform management unit may ensure there are no routing conflicts with the other dynamic regions. In the example, the platform management unit 420 configures the streaming hub 330 based on the properties of the new plugin in DR 204a. In the example, the streaming hub 330 and the platform management unit 420 ensure there are no routing conflicts with the other dynamic regions 204b and 204c.

At block 622, the platform management unit disables electrical isolation between the identified DR and the shell. In the example, the platform management unit 420 deactivates the isolation block 440a to disable isolation of DR 204a from the shell of the IC 400.

At block 624, the platform management unit optionally configures the plugin(s). In the example, the platform management unit 420 may configure the new plugin(s) in the DR 204a.

At block 626, the platform management unit releases the plugin(s) in the identified DR from reset, if block 616 was performed. In the example, the platform management unit 420 releases the plugin(s) placed in the DR 204a from reset.

At block 628, the platform management unit notifies the host that the new plugin is active and running. In the example, the platform management unit 420 notifies the host system 100 that the new plugin in DR 204a is active and running via the mailbox 312 or some other mechanism.

By following the algorithm 600, the platform management unit and corresponding hardware blocks ensure that a plugin(s) can be safely swapped out in one dynamic region (in one PR region) without affecting any other dynamic region (PR region).

According to aspects of the present disclosure, blocks 604, 606, 608, 610, and 612 may be performed to safely unload a plugin.

In aspects of the present disclosure, it may be advantageous to assign an administrator user at a system level who is allowed full access to the system and can configure the platform and platform management unit to enable non-administrator users access to one or all dynamic regions in the system. This feature ensures that, when multiple untrusted users are using the system, each untrusted user only has access to their own respective dynamic region.

Figure 7:
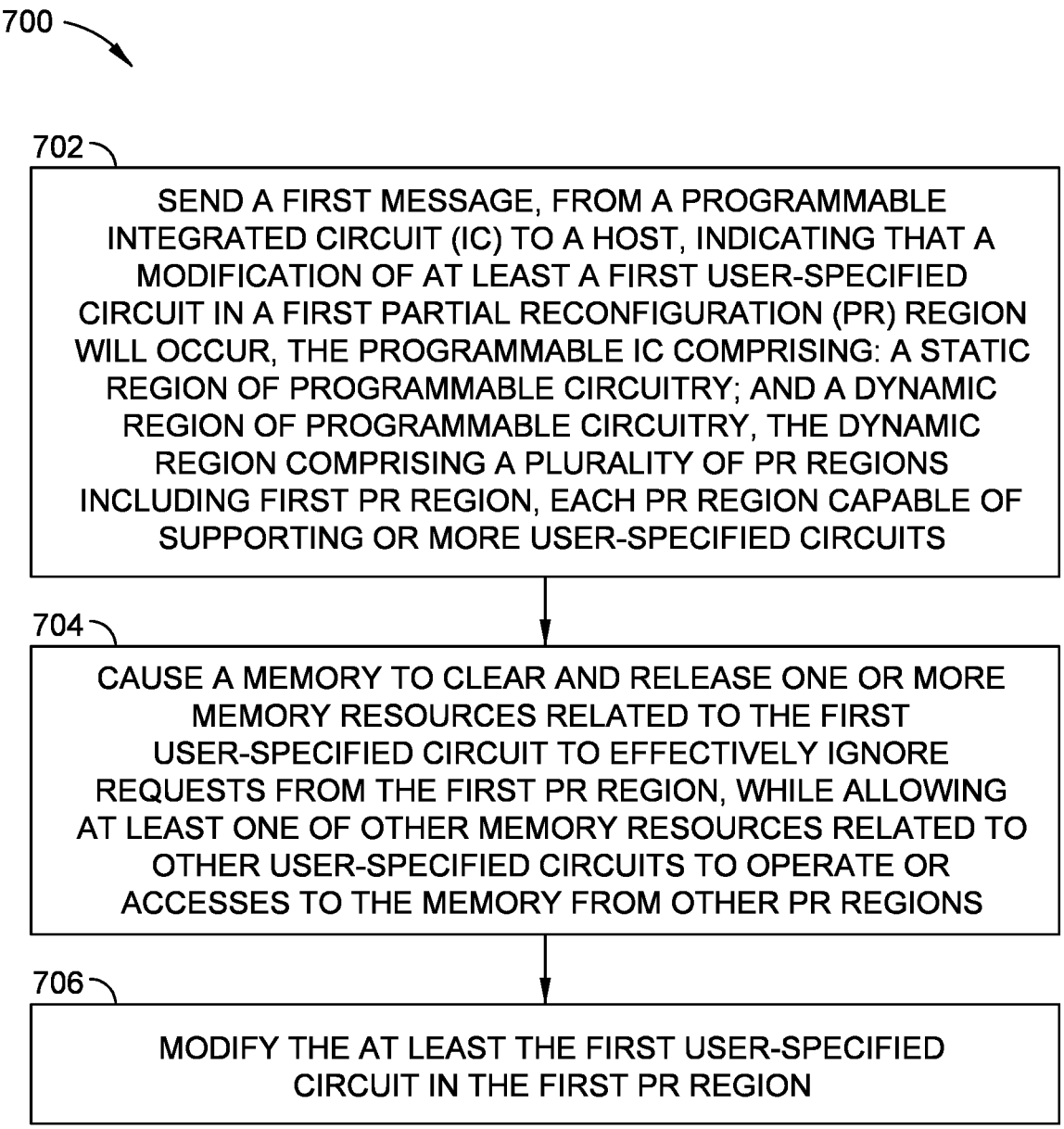
FIG. 7 is a flow diagram of example operations for dynamic modification, in accordance with an example of the present disclosure.

FIG. 7 depicts a flow diagram of example operations 700 for downloading a plugin to a multiple dynamic region platform. The operations 700 may be performed by a programmable IC, or more particularly by a platform management unit and associated circuitry in a programmable IC, such as the programmable IC 400 and platform management unit 420 of FIGS. 4 and 5 and the programmable IC 132 of FIG. 2. The flow diagram includes blocks representing the operations 700.

The operations 700 may begin, at block 702, by sending a first message, from a programmable integrated circuit (IC) to a host, indicating that a modification of at least a first user-specified circuit in a first partial reconfiguration (PR) region will occur. The programmable IC may include a static region of programmable circuitry and a dynamic region of programmable circuitry. The dynamic region comprises a plurality of PR regions including the first PR region. Each PR region is capable of supporting one or more user-specified circuits. In some examples, this corresponds to sending a first message, from the programmable IC 400 to the host system 100, indicating that a modification of at least a first user-specified circuit (e.g., user-specified circuitry 216 associated with plugin 302) in a first partial reconfiguration (PR) region (e.g., region 204a) will occur, shown in FIGS. 2, 4, and 5.

The operations 700 continue, at block 704, by causing a memory to clear and release one or more memory resources related to the first user-specified circuit and to effectively ignore requests (e.g., read and write requests) from the first PR region, while allowing at least one of: (a) other memory resources related to other user-specified circuits to operate or (b) accesses to the memory from other PR regions (e.g., without affecting the other memory resources or the accesses to the memory from the other PR regions). In some examples, this corresponds to causing memory access controller 242 to clear and release one or more memory resources in volatile memory 134 related to the first user-specified circuit and to effectively ignore requests from the first PR region (e.g., region 204a), while allowing at least one of: (a) other memory resources related to other user-specified circuits (user-specified circuitry 254 associated with plugins 304 and/or 306) to operate or (b) accesses to the memory from other PR regions (e.g., region 204b or 204c), shown in FIGS. 2, 4, and 5.

The operations 700 proceed, at block 706, by modifying the at least the first user-specified circuit in the first PR region. In some examples, this corresponds to modifying the at least the first user-specified circuit (e.g., user-specified circuitry 216 associated with plugin 302) in the first PR region (e.g., region 204a), shown in FIGS. 2, 4, and 5.

According to some examples, the modifying of block 706 involves modifying the at least the first user-specified circuit (e.g., associated with plugin 302, shown in FIGS. 4 and 5) in the first PR region (e.g., DR 204a) without disrupting operation of the other PR regions (e.g., DRs 204b and 204c).

According to some examples, the modifying of block 706 involves unloading a user kernel (e.g., plugin 302, shown in FIGS. 4 and 5) corresponding to the first user-specified circuit from the first PR region (e.g., DR 204a).

According to some examples, the operations 700 further include receiving a request from the host (e.g., host system 100, shown in FIGS. 4 and 5) to download a user kernel (e.g., a new plugin 302). In this case, the operations 700 may further include inspecting the user kernel and, based on the inspection, selecting one of the plurality of PR regions to which to download the user kernel. In this case, the selected PR region may be the first PR region. For some examples, the operations 700 may further include downloading a bitstream with the user kernel and replacing the first user-specified circuit with a second user-specified circuit based on the user kernel. In some cases, the operations 700 may further include enabling electrical isolation between the first PR region and the static region before the downloading and disabling the electrical isolation between the first PR region and the static region after the replacing. In some cases, the operations 700 may further involve holding at least the second user-specified circuit in reset after the downloading and the replacing and releasing the at least the second user-specified circuit from the reset after a predefined process has occurred. This predefined process may be, for example, after the new data flows are set up, after the electrical isolation is disabled, or after the second user-specified circuit is optionally configured. In some cases, the operations 700 may further include configuring memory access according to at least one of the second user-specified circuit or the user kernel. In some cases, the operations 700 may further involve configuring the second user-specified circuit. In some cases, the operations 700 may further include sending a second message, from the programmable IC to the host, indicating that the second user-specified circuit is operational. In some cases, the operations 700 may further include requesting a stream traffic manager (e.g., a streaming hub) to clean any data flows associated with the first PR region and to ignore new data packets from the first PR region, without affecting other data flows related to the other PR regions (e.g., while allowing the other data flows related to the other PR regions). In some such cases, the operations 700 may further include downloading a bitstream with the user kernel; replacing the first user-specified circuit with a second user-specified circuit based on the user kernel; and configuring the stream traffic manager to set up one or more new data flows according to at least one of the second user-specified circuit or the user kernel.

According to some examples, the programmable IC (e.g., programmable IC 400, shown in FIGS. 4 and 5) and the memory (e.g., memory 134) are part of a hardware acceleration card (e.g., hardware acceleration card 104, shown in FIG. 1).

Example Programmable Integrated Circuits

The multiple dynamic region circuits described herein may be implemented for a network interface of a computer system, such as a server. A multiple dynamic region circuit (e.g., the programmable IC 400) may be included in any of various suitable devices or systems, such as an integrated circuit (IC) or module.

One type of IC that may implement a multiple dynamic region circuit is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs known as "mask programmable devices" are programmed by applying a processing layer, such as a metal layer, that selectively interconnects the various elements on the device according to the programmable mask. The phrase "programmable IC" can also encompass devices that are only partially programmable, such as application-specific integrated circuits (ASICs).

Figure 8:
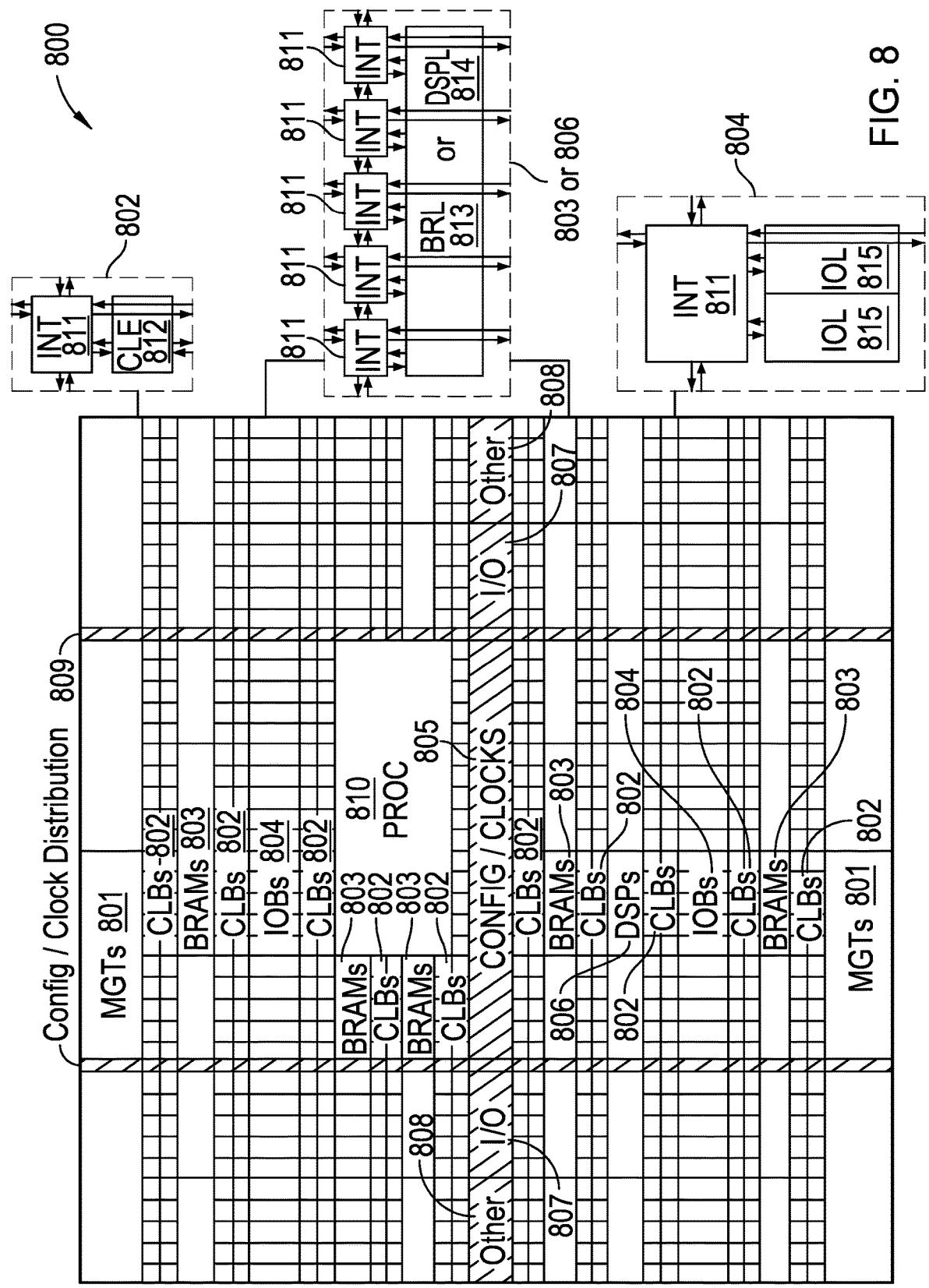
FIG. 8 is a block diagram illustrating an example architecture for a programmable device, in which aspects of the present disclosure may be practiced.

FIG. 8 is a block diagram illustrating an example architecture 800 for a programmable device. The architecture 800 may be implemented within a field programmable gate array (FPGA), for example. As shown, the architecture 800 includes several different types of programmable circuitry (e.g., logic blocks). For example, the architecture 800 may include a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing (DSP) blocks 806, specialized I/O blocks 807 (e.g., configuration ports and clock ports), and other programmable logic 808, such as digital clock managers, analog-to-digital converters (ADCs), system monitoring logic, and the like.

In some FPGAs, each programmable tile includes a programmable interconnect element (INT) 811 having standardized connections to and from a corresponding INT 811 in each adjacent tile. Therefore, the INTs 811, taken together, implement the programmable interconnect structure for the illustrated FPGA. Each INT 811 also includes the connections to and from the programmable logic element within the same tile, as shown by the examples included at the far right of FIG. 8.

For example, a CLB 802 may include a configurable logic element (CLE) 812 that can be programmed to implement user logic plus a single INT 811. A BRAM 803 may include a BRAM logic element (BRL) 813 in addition to one or more INTs 811. Typically, the number of INTs 811 included in a tile depends on the width of the tile. In the pictured example, a BRAM tile has the same width as five CLBs, but other numbers (e.g., four) can also be used. A DSP block 806 may include a DSP logic element (DSPL) 814 in addition to an appropriate number of INTs 811. An IOB 804 may include, for example, two instances of an I/O logic element (IOL) 815 in addition to one instance of an INT 811. As will be clear to a person having ordinary skill in the art, the actual I/O pads connected, for example, to the IOL 815 typically are not confined to the area of the IOL 815.

In the example architecture 800 depicted in FIG. 8, a horizontal area near the center of the die (shown shaded in FIG. 8) is used for configuration and clocking logic (CONFIG/CLOCKS 805). Other vertical areas 809 extending from this central area may be used to distribute the clocks and configuration signals across the breadth of the FPGA.

Some FPGAs utilizing the architecture 800 illustrated in FIG. 8 include additional logic blocks that disrupt the regular row structure making up a large part of the FPGA. The additional logic blocks may be programmable blocks and/or dedicated circuitry. For example, a processor block depicted as PROC 810 spans several rows of CLBs 802 and BRAMs 803.

The PROC 810 may be implemented as a hard-wired processor that is fabricated as part of the die that implements the programmable circuitry of the FPGA. The PROC 810 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 810 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 8 that are external to the PROC 810 may be considered part of the, or the, programmable circuitry of the FPGA.

FIG. 8 is intended to illustrate an example architecture 800 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 8 are exemplary. In an actual FPGA, for example, more than one adjacent row of CLBs 802 is typically included wherever the CLBs appear, in an effort to facilitate the efficient implementation of a user circuit design. The number of adjacent CLB rows, however, can vary with the overall size of the FPGA. Further, the size and/or positioning of the PROC 810 within the FPGA is for purposes of illustration only and is not intended as a limitation of the one or more examples of the present disclosure.

Conclusion

Network attached acceleration refers to processing that is typically performed on a network interface card (NIC) that is plugged into a data processing system, such as a server (e.g., a host system), via a communication bus. The NIC may include a field programmable gate array (FPGA) connected to an application-specific integrated circuit (ASIC). The ASIC typically receives data through network ports and performs basic packet processing functions while the FPGA is used to perform other enhanced network acceleration functions referred to as "Smart NIC" functions on the data. The ASIC may then deliver the processed data to the host system.

A single programmable IC (e.g., an FPGA) may be used to provide both the ASIC functionality and the enhanced or Smart NIC functions. The platform described herein, as implemented in a programmable IC, supports the data processing described and the ability to implement different custom or user-specified circuits over time without disrupting the ability of the programmable IC to continue performing basic NIC functions. Thus, portions of the programmable IC may be dynamically reconfigured (e.g., partially reconfigured) to perform packet processing operations relating to compute, storage, and/or networking acceleration functions while other regions on the programmable IC are able to continue operating uninterrupted so as not to lose data or the communication link to the network. The programmable IC may also maintain the communication link to the host system. As such, the programmable IC is capable of continuing to pass data between the network and the host system without losing data while one or more different user-specified circuits are dynamically inserted, removed, and/or replaced at runtime for processing the network data.

Additional Considerations

In the preceding, reference is made to examples presented in this disclosure. However, the scope of the present disclosure is not limited to specific described examples. Instead, any combination of the described features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the preceding aspects, features, embodiments, and advantages are merely illustrative and are not considered elements or limitations of the attached claims except where explicitly recited in one or more of the claims.

As will be appreciated by one skilled in the art, the examples disclosed herein may be embodied as a system, method, or apparatus, and the like. Accordingly, examples may take the form of an entirely hardware embodiment or a combination of hardware products or an embodiment combining hardware aspects with corresponding programming that may all generally be referred to herein as a "circuitry" or "system." Furthermore, certain aspects, such as programmable logic blocks, lookup tables (LUTs), and the like, may take the form of hardware components that can be controlled using corresponding programming.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In the context of this document, a computer-readable storage medium is any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electrical, magnetic, optical, electromagnetic, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless (e.g., radio frequency (RF) or infrared), wireline, optical fiber or cable, etc., or any suitable combination of the foregoing.

Computer program code for carrying out operations or programming for examples of the present disclosure may be written in any combination of one or more programming languages, including an object oriented programming language such as Java, Smalltalk, C++ or the like and procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Examples of the present disclosure are described herein with reference to flowchart illustrations and/or block diagrams of methods, apparatus (e.g., systems), and computer program products presented herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

For example, means for sending data and/or means for switching to send data may include a PCIe controller or a DMA circuit, such as the PCIe controller 212 or DMA circuit 210 illustrated in FIGS. 2, 3, 4, and 5, and more particularly, a data input of such a PCIe controller or DMA circuit. Means for causing a memory to clear and release one or more memory resources may include a memory access controller, such as the memory access controller 242 depicted in FIGS. 2, 3, 4, and 5. Means for sampling may include a data sampler in the receiver. Means for modifying a user-specified circuit may include a mailbox (e.g., mailbox 312 in FIGS. 4 and 5), platform management unit (e.g., platform management unit 420 in FIGS. 4 and 5), or configuration portal (e.g., configuration portal 410 in FIGS. 4 and 5).

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer-implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and apparatus according to various examples of the present disclosure. In this regard, each block in the flowchart or block diagrams may represent circuitry, programming for such circuitry, or portion of instructions for such circuitry, which comprises one or more executable instructions for controlling or programming the circuitry to perform the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

The invention claimed is:

1. A programmable integrated circuit (IC) comprising:
a static region of programmable circuitry; and
a dynamic region of programmable circuitry, the dynamic region comprising a plurality of partial reconfiguration (PR) regions, each PR region being capable of supporting one or more user-specified circuits, wherein the programmable IC is configured to:
  send a first message to a host, indicating that a modification of at least a first user-specified circuit in a first PR region of the plurality of PR regions will occur;
  cause a memory to clear and release one or more memory resources related to the first user-specified circuit and to effectively ignore requests from the first PR region, while allowing at least one of:
    other memory resources related to other user-specified circuits to operate; or
    accesses to the memory from other PR regions; and
  modify the at least the first user-specified circuit in the first PR region.

2. The programmable IC of claim 1, wherein the programmable IC is configured to modify the at least the first user-specified circuit in the first PR region without disrupting operation of the other PR regions.

3. The programmable IC of claim 1, wherein the programmable IC is configured to modify the at least the first user-specified circuit by unloading a user kernel corresponding to the first user-specified circuit from the first PR region.

4. The programmable IC of claim 1, wherein the programmable IC is further configured to:
receive a request from the host to download a user kernel;
inspect the user kernel; and
select, based on the inspection, one of the plurality of PR regions to which to download the user kernel, the selected PR region being the first PR region.

5. The programmable IC of claim 4, wherein the programmable IC is further configured to:
download a bitstream with the user kernel; and
replace the first user-specified circuit with a second user-specified circuit based on the user kernel.

6. A method of dynamic modification, comprising:
sending a first message, from a programmable integrated circuit (IC) to a host, indicating that a modification of at least a first user-specified circuit in a first partial reconfiguration (PR) region will occur, the programmable IC comprising:
a static region of programmable circuitry; and
a dynamic region of programmable circuitry, the dynamic region comprising a plurality of PR regions including the first PR region, each PR region being capable of supporting one or more user-specified circuits;
causing a memory to clear and release one or more memory resources related to the first user-specified circuit and to effectively ignore requests from the first PR region, while allowing at least one of:
  other memory resources related to other user-specified circuits to operate; or
  accesses to the memory from other PR regions; and
modifying the at least the first user-specified circuit in the first PR region.

7. The method of claim 6, wherein the modifying comprises modifying the at least the first user-specified circuit in the first PR region without disrupting operation of the other PR regions.

8. The method of claim 6, wherein the modifying comprises unloading a user kernel corresponding to the first user-specified circuit from the first PR region.

9. The method of claim 6, further comprising receiving a request from the host to download a user kernel.

10. The method of claim 9, further comprising:
inspecting the user kernel; and
based on the inspection, selecting one of the plurality of PR regions to which to download the user kernel, the selected PR region being the first PR region.

11. The method of claim 10, further comprising:
downloading a bitstream with the user kernel; and
replacing the first user-specified circuit with a second user-specified circuit based on the user kernel.

12. The method of claim 11, further comprising:
enabling electrical isolation between the first PR region and the static region before the downloading; and
disabling the electrical isolation between the first PR region and the static region after the replacing.

13. The method of claim 11, further comprising:
holding at least the second user-specified circuit in reset after the downloading and the replacing; and
releasing the at least the second user-specified circuit from the reset after a predefined process has occurred.

14. The method of claim 11, further comprising configuring memory access according to at least one of the second user-specified circuit or the user kernel.

15. The method of claim 11, further comprising configuring the second user-specified circuit.

16. The method of claim 11, further comprising sending a second message, from the programmable IC to the host, indicating that the second user-specified circuit is operational.

17. The method of claim 10, further comprising requesting a stream traffic manager to clean any data flows associated with the first PR region and to ignore new data packets from the first PR region, while allowing other data flows related to the other PR regions.

18. The method of claim 17, further comprising:
downloading a bitstream with the user kernel;
replacing the first user-specified circuit with a second user-specified circuit based on the user kernel; and
configuring the stream traffic manager to set up one or more new data flows according to at least one of the second user-specified circuit or the user kernel.

19. The method of claim 6, wherein the programmable IC and the memory are part of a hardware acceleration card.

20. A hardware acceleration card comprising:
a memory; and
a programmable integrated circuit (IC) coupled to the memory, the programmable IC comprising:

a static region of programmable circuitry; and
a dynamic region of programmable circuitry, the dynamic region comprising a plurality of partial reconfiguration (PR) regions, each PR region being capable of supporting one or more user-specified circuits, wherein the programmable IC is configured to:
  send a first message to a host, indicating that a modification of at least one user-specified circuit in a PR region of the plurality of PR regions will occur;
  cause the memory to clear and release one or more memory resources related to the at least one user-specified circuit and to effectively ignore requests from the PR region, while allowing at least one of:
    other memory resources related to other user-specified circuits to operate; or
    accesses to the memory from other PR regions; and
  modify the at least one user-specified circuit in the PR region.

* * * * *